(12) United States Patent
Zudock et al.

(10) Patent No.: US 8,093,711 B2
(45) Date of Patent: Jan. 10, 2012

(54) SEMICONDUCTOR DEVICE

(75) Inventors: Frank Zudock, Regensburg (DE);
Thorsten Meyer, Regensburg (DE);
Markus Brunnbauer, Lappersdorf
(DE); Andreas Wolter, Regensburg
(DE)

(73) Assignee: Infineon Technologies AG, Neubiberg
(DE)

( * ) Notice: Subject to any disclaimer, the term of this patent is extended or adjusted under 35 U.S.C. 154(b) by 60 days.

(21) Appl. No.: 12/364,340

(22) Filed: Feb. 2, 2009

(65) Prior Publication Data

US 2010/0193928 A1      Aug. 5, 2010

(51) Int. Cl.
*H01L 23/04*           (2006.01)
(52) U.S. Cl. .............. 257/698; 257/774; 257/E23.067; 257/E23.174
(58) Field of Classification Search ........... 257/E23.168, 257/E23.174
See application file for complete search history.

(56) References Cited

U.S. PATENT DOCUMENTS

| | | | |
|---|---|---|---|
| 4,939,568 A * | 7/1990 | Kato et al. .................. | 257/686 |
| 5,202,754 A * | 4/1993 | Bertin et al. ................ | 257/684 |
| 5,424,245 A | 6/1995 | Gurtler et al. | |
| 6,569,762 B2 | 5/2003 | Kong | |
| 6,960,837 B2 | 11/2005 | Iadanza | |
| 7,247,518 B2 | 7/2007 | Shibata | |
| 7,480,426 B1 * | 1/2009 | Dellmann et al. ............. | 385/14 |
| 2006/0087044 A1 | 4/2006 | Goller | |
| 2006/0131721 A1 | 6/2006 | Ito | |
| 2007/0222050 A1 | 9/2007 | Lee et al. | |
| 2008/0136004 A1 | 6/2008 | Yang et al. | |
| 2008/0272465 A1 * | 11/2008 | Do et al. .................... | 257/620 |
| 2008/0274603 A1 * | 11/2008 | Do et al. .................... | 438/462 |
| 2009/0008793 A1 | 1/2009 | Pohl et al. | |
| 2010/0133704 A1 * | 6/2010 | Marimuthu et al. .......... | 257/778 |

FOREIGN PATENT DOCUMENTS

DE           102 05 026        5/2003
DE      10 2008 028 072        1/2009

OTHER PUBLICATIONS

Brunnbauer et al., "Embedded Wafer Level Ball Grid Array (eWLB)," 2006 Electronics Packaging Technology Conference, Copyright 2006, 5 pages.

* cited by examiner

*Primary Examiner* — Ha Tran T Nguyen
*Assistant Examiner* — Shaka Scarlett
(74) *Attorney, Agent, or Firm* — Dicke, Billig & Czaja, PLLC

(57) ABSTRACT

A semiconductor device includes a semiconductor chip having a through-connection extending between a first main face of the semiconductor chip and a second main face of the semiconductor chip opposite the first main face, encapsulation material at least partially encapsulating the semiconductor chip, and a first metal layer disposed over the encapsulation material and connected with the through-connection.

22 Claims, 7 Drawing Sheets

SEMICONDUCTOR DEVICE

BACKGROUND

A semiconductor package provides a protective enclosure for one or more semiconductor chips and includes interconnects to the chip(s). Semiconductor packages are employed in mobile electronic devices, including cellular telephones and other communication devices, automotive electronics, as well as other technology platforms.

Some semiconductor packages are configured to be compatible with package-on-package stacking technologies in which a separate electronic component is stacked on a base package. Such package-on-package stacks include the base package fabricated to include landing pad(s) that receive/connect an upper package with semiconductor chip(s) in the base package. It is desirable to provide package-on-package semiconductor stacks with improved interconnect geometry and in a manner that does not deleteriously increase the base package size.

For these and other reasons there is a need for the present invention.

SUMMARY

One embodiment provides a semiconductor device including a semiconductor chip having a through-connection extending between a first main face of the semiconductor chip and a second main face of the semiconductor chip opposite the first main face, encapsulation material at least partially encapsulating the semiconductor chip, and a first metal layer disposed over the encapsulation material and connected with the through-connection.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Embodiments provide an embedded wafer level base package including at least one semiconductor chip formed to include at least one through-connection or through-silicon via extending through the chip. The package is fabricated to include a lower metal layer configured for attachment to an electronic board, for example a lower redistribution layer that is attached to a printed circuit board by a solder ball. The package includes an upper metal layer that forms a landing pad configured to receive another package in a stacked package-on-package configuration. The through-connection enables vertical and three-dimensional interconnection in the embedded wafer level base package.

Embodiments provide embedded wafer level packages configured for package-on-package stacking that eliminates the use of expensive substrates common to ball grid array packages. The through-connections formed as through-silicon vias in the semiconductor chip eliminates the use of long metal wires that are employed to connect conventional side-by-side or two-dimensional chips together. The embedded wafer level base package including the through-silicon via provides Z-directional electrical connection through the semiconductor chip for improved radio-frequency performance with lower power consumption. The embedded wafer level package including chips with one or more through-silicon vias provide a reduced package size and reduced package thickness.

Figure 1:
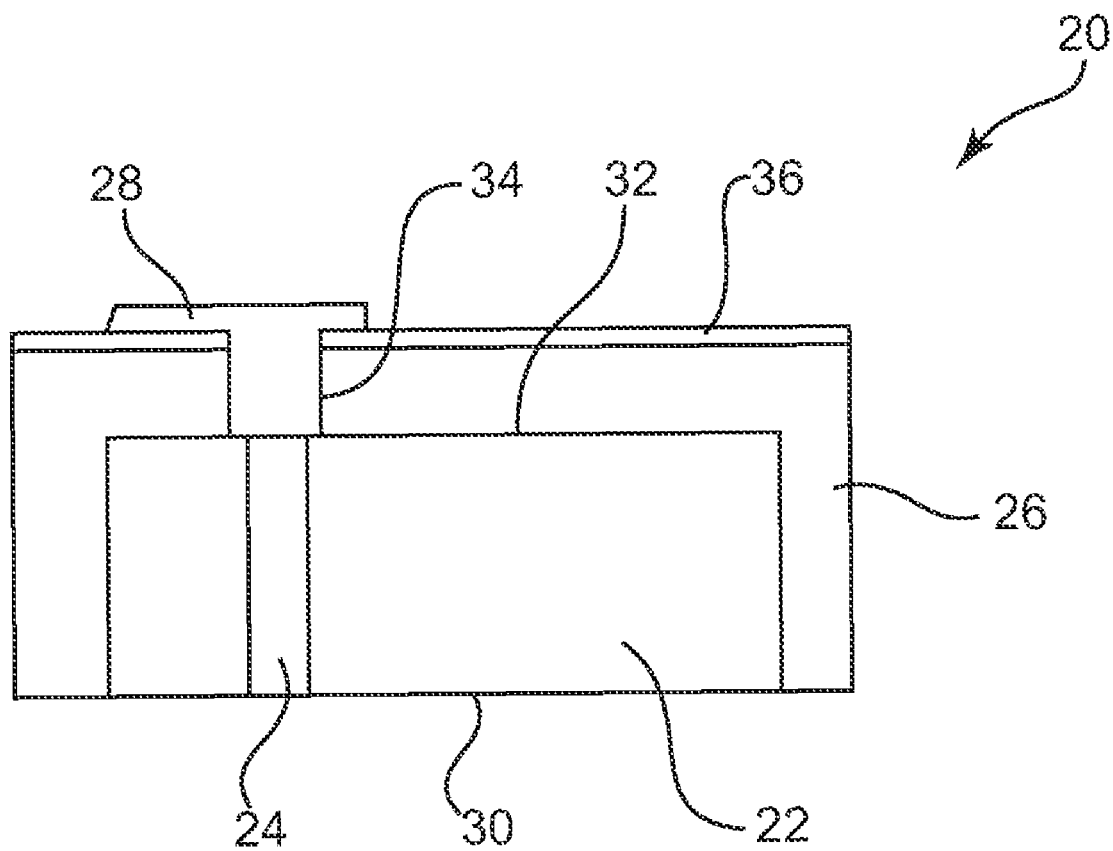
FIG. 1 is a schematic cross-sectional view of a semiconductor device according to one embodiment.

FIG. 1 is a schematic cross-sectional view of a semiconductor device 20 according to one embodiment. Semiconductor device 20 includes a semiconductor chip 22 formed to include a through-connection 24, encapsulation material 26 at least partially encapsulating semiconductor chip 22, and a first metal layer 28 disposed over encapsulation material 26 and connected with through-connection 24.

In one embodiment, semiconductor chip 22 includes a first main face 30 opposite a second main face 32, where through-connection 24 extends between first main face 30 and second main face 32. In one embodiment, first main face 30 includes an active surface of semiconductor chip 22 that is provided with active surface connections. In one embodiment, second main face 32 of semiconductor chip 22 provides another active surface of semiconductor chip 22 and includes active surface connections.

In one embodiment, an opening 34 is formed through encapsulation material 26 and a dielectric layer 36 to enable first metal layer 28 to connect with through-connection 24.

In one embodiment, semiconductor chip 22 is a logic chip, or a memory chip, or another form of a suitable semiconductor chip. Suitable semiconductor chips include integrated circuits configured as logic circuits, control circuits, microprocessors or microelectrical-mechanical components, memory chips, power semiconductor chips such as power transistors, power diodes, insulated gate bi-polar transistors, vertical chips configured such that electric current flows in the Z-direction between main faces 30/32, embedded chips, or flip chips. In one embodiment, chip 22 is provided as a vertical power transistor having a first electrode connected to one of a source/drain on first main face 30 and a second electrode connected to the other of the source/drain on second main face 32.

In one embodiment, though-connection 24 is formed as a through-hole (112 in FIG. 4A) that is filled with metal, such as copper, gold, silver, aluminum, or alloys of these metals, or other electrically conducting metals. Through-connection 24 provides for electrical communication between main faces 30, 32 of semiconductor chip 22 and is configured to provide enhanced radio-frequency performance with reduced power consumption by shortening the connection length through the thickness (or Z-direction) of device 20. Suitable processes for forming an opening through the silicon portion of semiconductor chip 22 include deep silicon etching (DRIE) or laser drilling.

Encapsulation material 26 includes material that is generally non-electrically conducting. Suitable material for encapsulation material 26 includes polymers and/or epoxies. In one embodiment, dielectric 36 is deposited on encapsulation material 26 and suitably patterned (opened) for connection of first metal layer 28 with through-connection 24. In one embodiment, encapsulation material 26 is disposed around semiconductor chip 22 over second main face 32, leaving first main face 30 uncovered such that encapsulation material 26 is co-planar with first main face 30.

Figure 2:
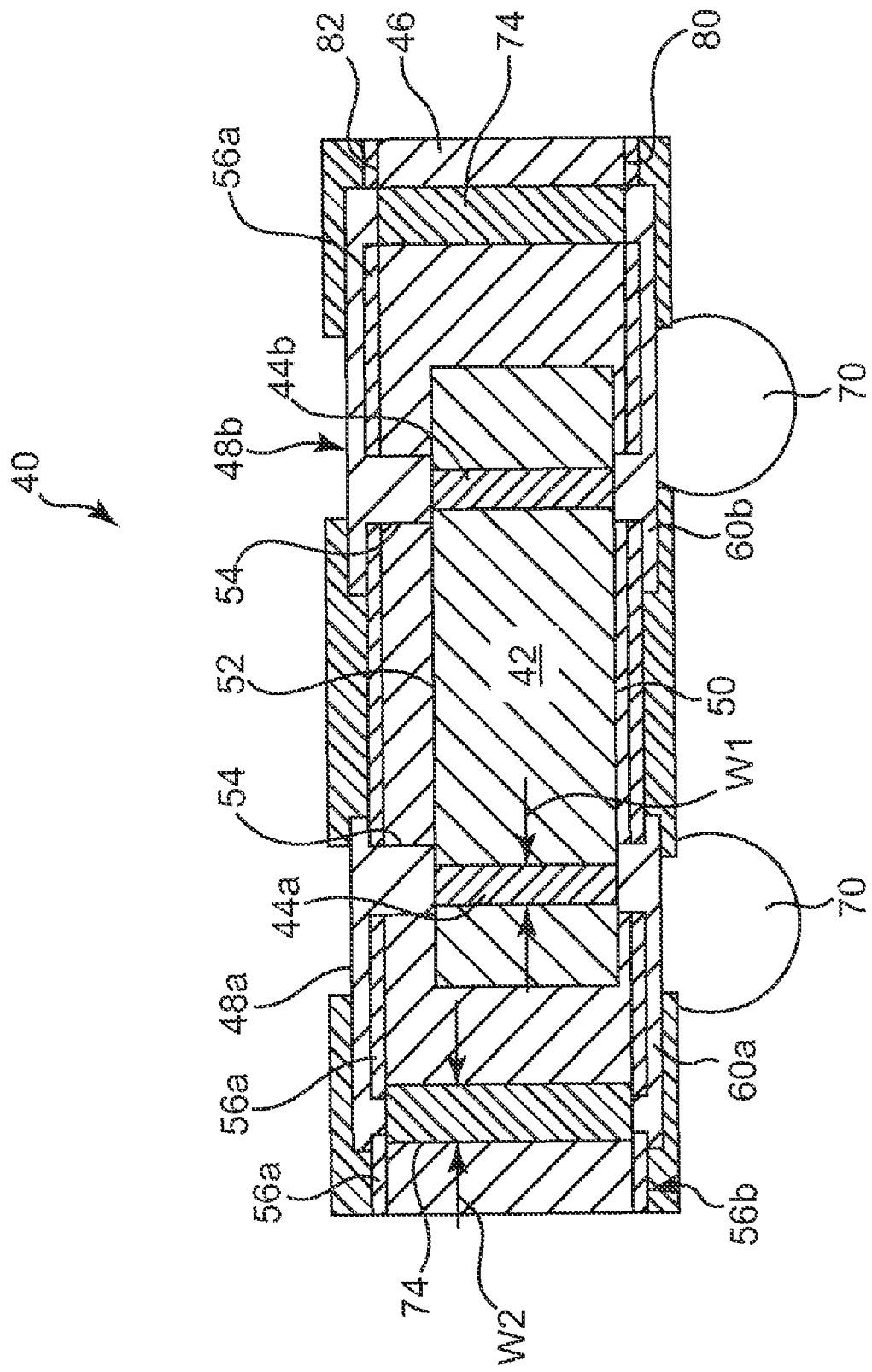
FIG. 2 is a schematic cross-sectional view of another semiconductor device according to one embodiment.

FIG. 2 is a schematic cross-sectional view of another semiconductor device 40 according to one embodiment. Semiconductor device 40 includes a semiconductor chip 42 formed to include multiple through-silicon vias (TSV) 44a, 44b, encapsulation material 46 at least partially encapsulating semiconductor chip 42, and a metal layer 48a connected with TSV 44a and a metal layer 48b connected with TSV 44b.

In one embodiment, TSV 44a, 44b are formed to extend through semiconductor chip 42 between a first main face 50 and a second main face 52. In one embodiment, openings 54 are formed extending through a potion of encapsulation material 46 and an upper dielectric layer 56a to enable connection of metal layers 48a, 48b with a respective one of TSV 44a, 44b.

In one embodiment, device 40 includes a lower dielectric layer 56b that is patterned to enable metal layer 60a to connect with TSV 44a and metal layer 60b to connect with TSV 44b. Device 40 thus includes first metal layers 48a, 48b connected with a respective one of TSV 44a, 44b and second metal layers 60a, 60b connected with a respective one of TSV 44a, 44b.

In one embodiment, first metal layers 48a, 48b provide landing pads configured to receive and electrically connect with another package placed on device 40. In one embodiment, metal layers 60a, 60b are connected with a printed circuit board, for example through connecting elements 70 such as solder balls.

TSV 44a, 44b provide three-dimensional electrical connection through semiconductor chip 42 with enhanced radio frequency performance and reduced power consumption. In one embodiment, device 40 includes one or more through-mold vias 74 that are formed to extend between opposed major surfaces 80, 82 of encapsulation material 46. Through-mold vias (TMV) 74 provide vertical electrical connection through device 40.

In one embodiment, TSV 44a is fabricated to include a width W1 and TMV 74 is fabricated to include a width W2, where the width W1 of TSV 44a is less than the width W2 of TMV 74.

In one embodiment, device 40 is provided as a logic device configured for use as a base package in a package-on-package system. Depending upon the format of semiconductor chip 42, device 40 is a logic device, a memory device, or other suitable semiconductor package.

Figure 3:
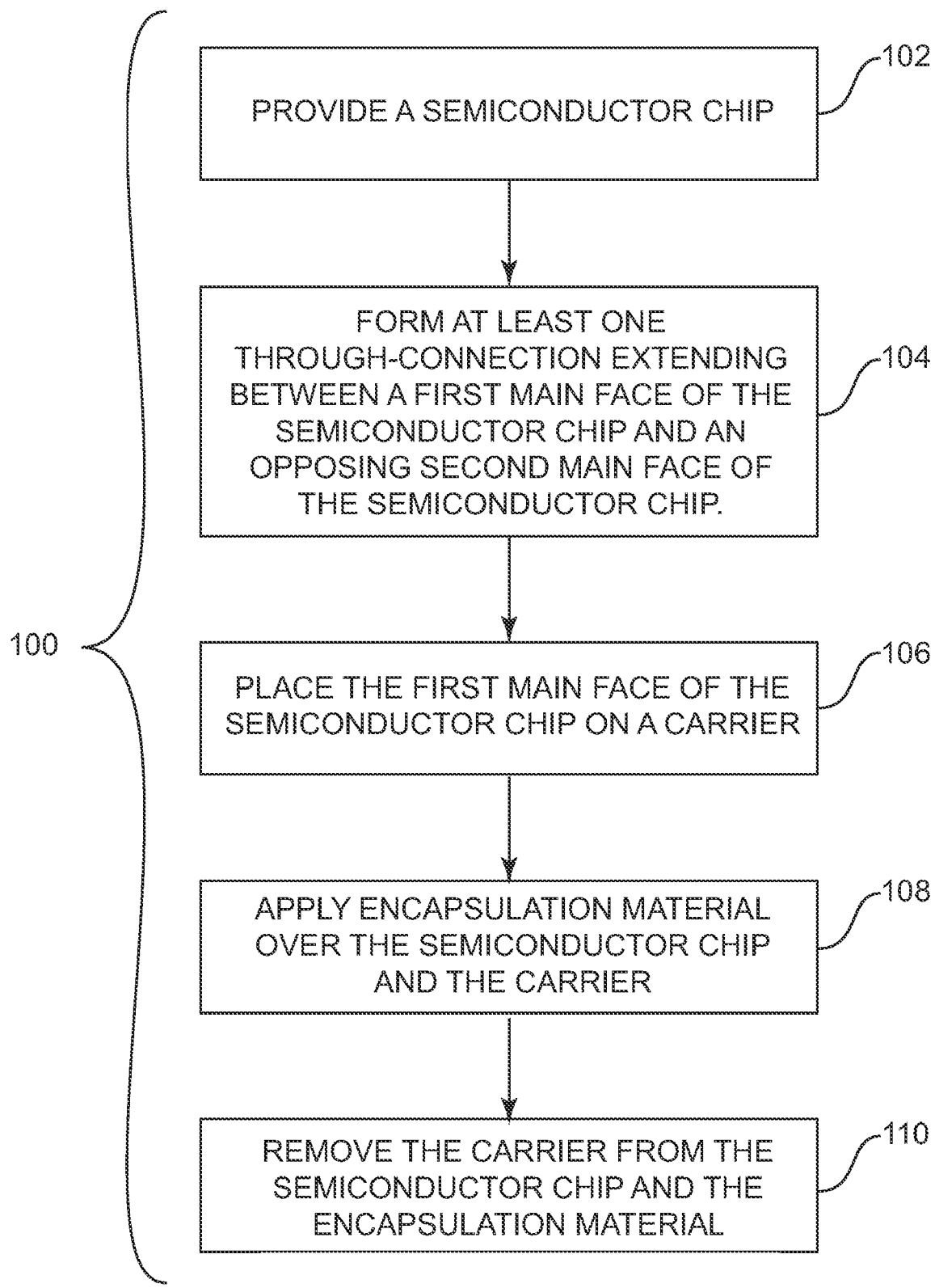
FIG. 3 is a block diagram of a process for manufacturing a semiconductor device according to one embodiment.

FIG. 3 is a block diagram 100 of a process for manufacturing a semiconductor device according to one embodiment. Process 100 includes providing a semiconductor chip at 102. At 104, at least one through-connection is formed to extend between a first main face of the semiconductor chip and an opposing second main face of the semiconductor chip. At 106, the first main face of the semiconductor chip is placed on a carrier. At 108, encapsulation material is applied over the semiconductor chip and the carrier. In one embodiment, the first main face is not covered by encapsulation material since the first main face is in contact with the carrier. At 110, the carrier is removed from the semiconductor chip and the encapsulation material. Embodiments of process 100 provide a manufacturing approach for embedded or fan-out wafer level package assembly, as further described below.

FIGS. 4A-4D provide schematic cross-sectional views of the fabrication of semiconductor device 20 (FIG. 1) according to one embodiment.

Figure 4A:
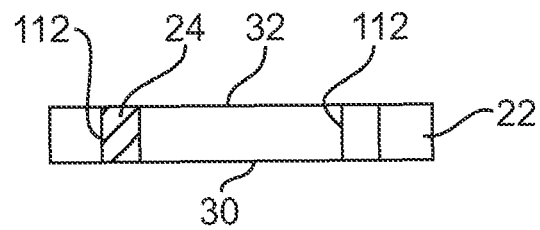
FIGS. 4A-4D are schematic cross-sectional views of a process for manufacturing a semiconductor device according to one embodiment.

FIG. 4A is a schematic cross-sectional view of semiconductor chip 22 including openings 112 that are filled with electrically conducting material to form though-connection 24. Through-connection 24 extends between first main face 30 and second main face 32 of chip 22.

Figure 4B:
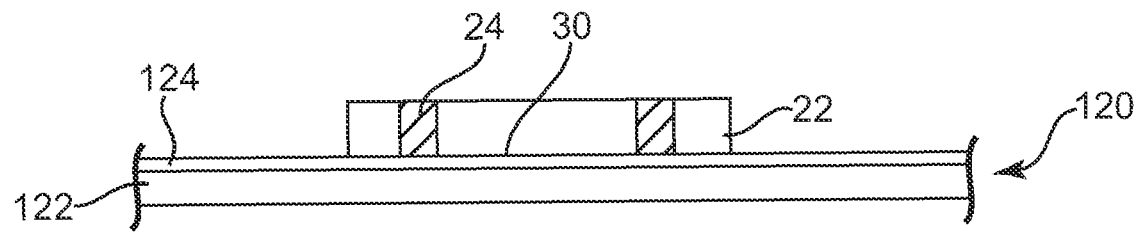

FIG. 4B is a schematic cross-sectional view of first main face 30 of chip 22 placed on a carrier 120. In one embodiment, carrier 120 includes a carrier substrate 122 and an adhesive layer 124 disposed on substrate 122. Carrier substrate 122 includes metal, plastic, paper, laminate or other suitable substrates for carrying chip 22. Chip 22 is picked and placed in position on adhesive layer 124 of carrier 120.

Figure 4C:
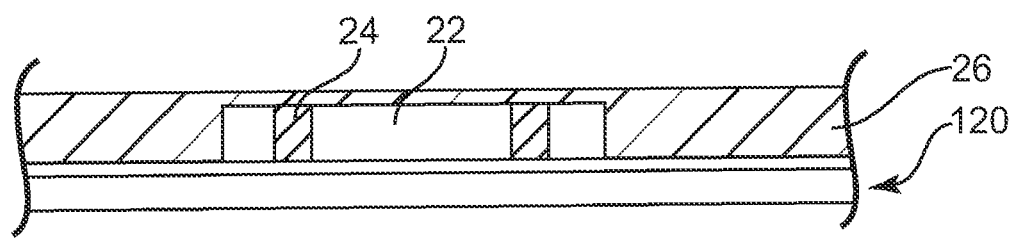

FIG. 4C is a schematic cross-sectional view of encapsulation material 26 disposed over carrier 120 to at least partially encapsulate chip 22. In one embodiment, encapsulation material 26 is injection molded over chip 22 and onto carrier 120. In one embodiment, encapsulation material 26 is compression molded over chip 22 and onto carrier 120. In one embodiment, encapsulation material 26 is planarized or chemically mechanically polished to achieve a desired thickness of material 26 over chip 22.

Figure 4D:
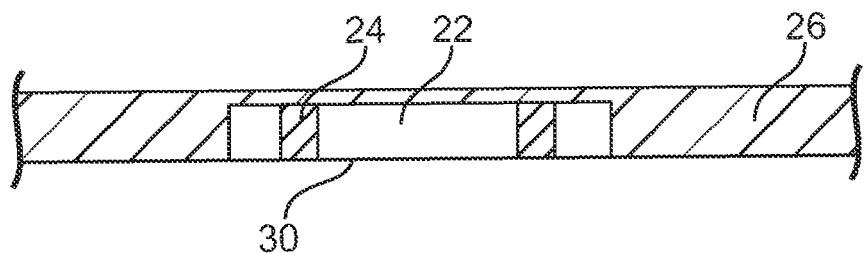

FIG. 4D is a schematic cross-sectional view of chip 22 partially encapsulated by encapsulation material 26. In one embodiment, after removal of carrier 120 (FIG. 4C), encapsulation material 26 is co-planar with first main face 30 of chip 22.

Figure 5:
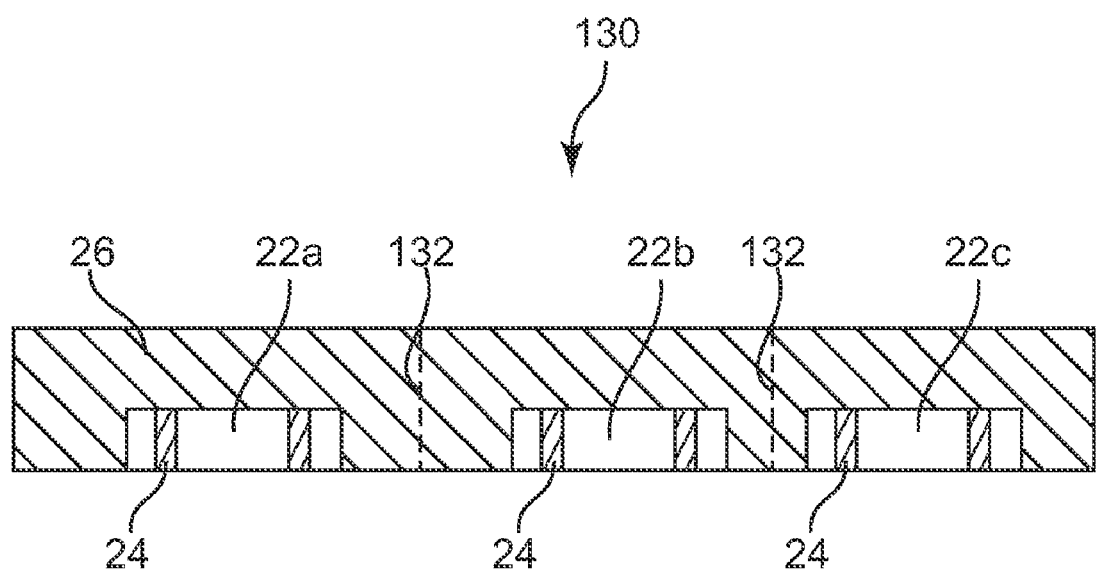
FIG. 5 is a schematic cross-sectional view of multiple semiconductor chips encapsulated by material, with each chip including a through-silicon via according to one embodiment.

FIG. 5 is a schematic cross-sectional view of semiconductor package units 130 fabricated according to embodiments described above in FIGS. 4A-4D to include multiple semiconductor chips 22a, 22b, 22c. Each of these multiple semiconductor chips 22a, 22b, 22c include one or more through-connections 24 extending between main faces of the chips.

Encapsulation material 26 covers at least a portion of the chips after the carrier 120 (FIG. 4C) is removed. In one embodiment, the package units 130 are configured for separation or singulation along saw streets 132. Sawing or dicing along saw streets 132 separates individual components 130 for subsequent fabrication into package 20 or package 40, as described above.

Figure 6:
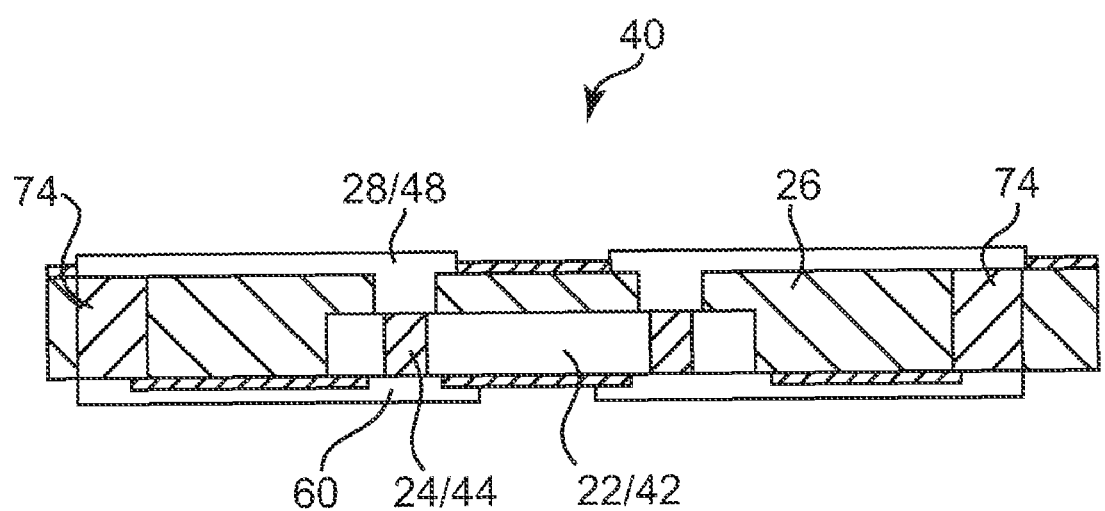
FIG. 6 is a schematic cross-sectional view of an embedded wafer level package including a semiconductor chip formed to include a through-silicon via encapsulated by material, with a through-mold via formed through the encapsulation material according to one embodiment.

FIG. 6 is a schematic cross-sectional view of semiconductor device 40 fabricated according to the manufacturing process described above. For example, the embedded chip 22 illustrated in FIG. 4D or the embedded chips 22a, 22b, 22c of the semiconductor units 130 illustrated in FIG. 5 are each suited for subsequent processing to include upper and lower metal layers connected with through-connections 24/44.

In one embodiment, semiconductor chip 22/42 is at least partially embedded in encapsulation material 26 and further processed to include upper metal first layers 28/48 electrically connected to through-connections 24/44, and lower or second metal layer 60 electrically connected to through-connections 24/44. In one embodiment, the Z-direction electrical connectivity through the semiconductor package 40 is supplemented with TMV 74 formed to extend through encapsulation material 26 between first metal layer 28/48 and second metal layer 60.

In one embodiment, semiconductor package 40 is configured for use as a base package in a package-on-package system by connecting second metal layer 60 to a printed circuit board, for example with solder balls or other suitable connecting elements. In one embodiment, semiconductor package 40 is a memory package or a logic package and configured for mounting to a base package in a package-on-package system.

Figure 7:
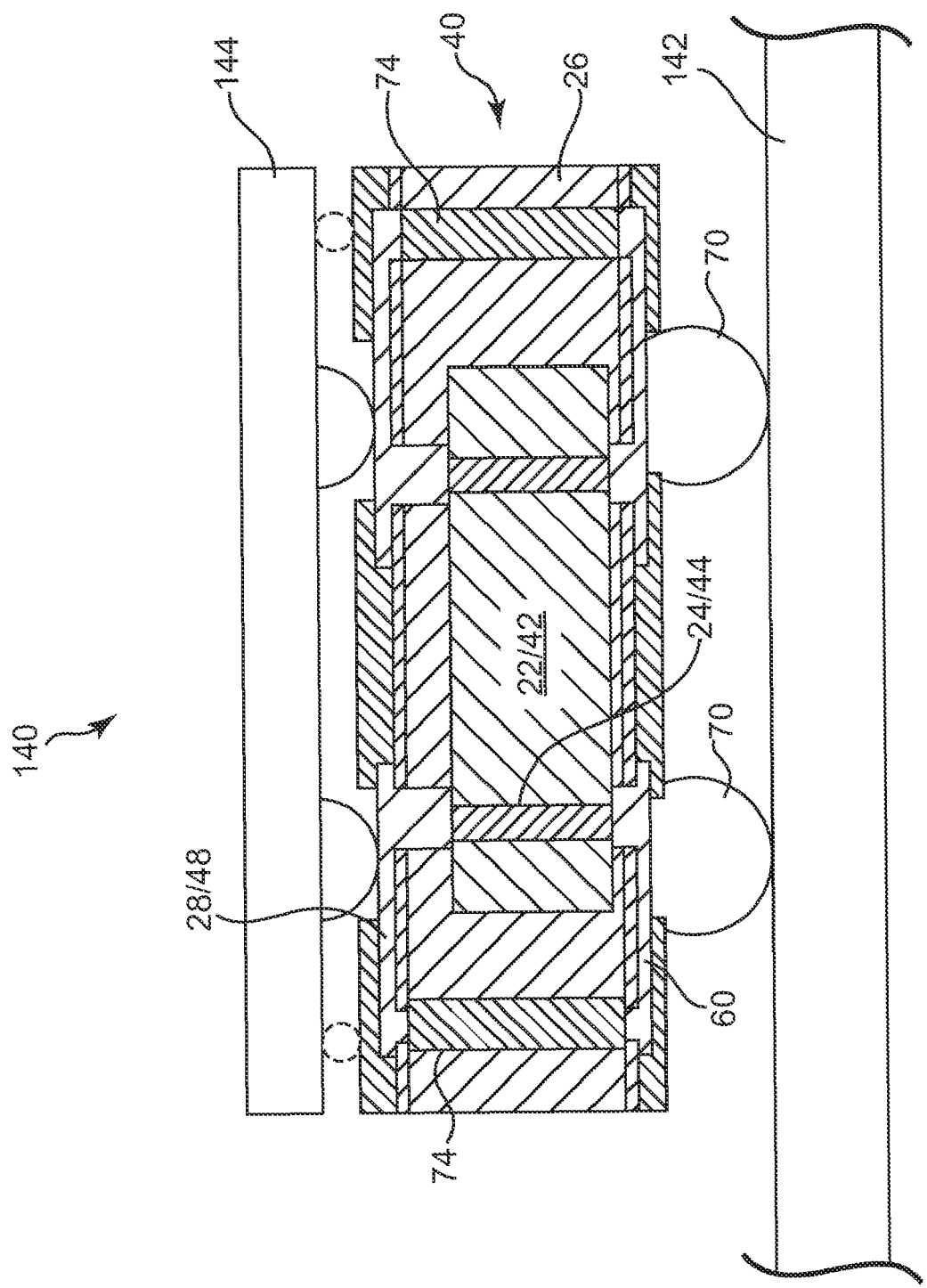
FIG. 7 is a schematic cross-sectional view of a package-on-package stack according to one embodiment.

FIG. 7 is a schematic cross-sectional view of a semiconductor package-on-package (POP) stack 140 according to one embodiment. POP stack 140 includes base semiconductor package 40 electrically connected to a printed circuit board 142, and another package 144 stacked on base semiconductor package 40. In one embodiment, solder balls 70 connect second metal layer 60 of base package 40 to printed circuit board 142. Second package 144 or top package 144 is electrically connected to landing pads provided by first metal layer 28/48. In this manner, electrical connection is established between second package 144 through landing pads 28/48, TSV 24/44, second metal layer 60, solder balls 70, and ultimately to printed circuit board 142.

In one embodiment, first metal layer 28/48 and second metal layer 60 are patterned redistribution layers patterned over an embedded chip 22 to provide an embedded package-on-package (ePOP) device 140.

In one embodiment, base package 40 is provided as a logic device and second package 144 is provided as a memory device. In one embodiment, base semiconductor package 40 is provided as a first memory device and second package 144 is provided as a second memory device. Printed circuit board 142 includes electronic boards, printed circuit boards, or other suitable electronic devices which POP 40/144 is electrically connected.

Embodiments provide a semiconductor package including one or more semiconductor chips provided with one or more through-silicon vias. Forming the via in the silicon portion of the chip provides a very uniform via as compared to through-mold vias. Through-mold vias have openings formed in the encapsulation material, which is typically highly filled with silica particles. The TMV are consequently formed to have a greater width compared to the TSV to account for the undercuts that are formed in the encapsulation material when the opening is formed.

Embodiments provide an embedded wafer level semiconductor package including through-silicon vias having three-dimensional interconnect geometry, smaller package sizes as compared to wire bonded packages, and improved radio-frequency with reduced power consumption.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of packages configured to support package-on-package semiconductor stacking, as discussed herein. Therefore, it is intended that this invention be limited only by the claims and the equivalents thereof.

What is claimed is:

1. A semiconductor device comprising:
   a semiconductor chip comprising a through-connection extending between a first main face of the semiconductor chip and a second main face of the semiconductor chip opposite the first main face;
   encapsulation material encapsulating the semiconductor chip and extending beyond lateral dimensions of the semiconductor chip and having a first main surface parallel with and adjacent to the first main face and a second main surface parallel with and adjacent to the second main face ; and
   a first metal layer disposed over the first main surface of the encapsulation material and connected with the through-connection;
   a second metal layer disposed over the second main surface of the encapsulation material and connected with the through-connection such that the first metal layer is disposed adjacent to the first main face and the second metal layer is disposed adjacent to the second main face; and
   at least one through-mold connection extending through the encapsulating material from the first main surface to the second main surface in a region of the encapsulation material beyond the lateral dimensions of the semiconductor chip, the at least one through-mold connection connected between the first and second metal layers.

2. The semiconductor device of claim 1, wherein one of the first main face and the second main face of the semiconductor chip is not encapsulated by the encapsulation material.

3. The semiconductor device of claim 1, wherein the semiconductor chip comprises a first active area on the first main face and a second active area on the second main face.

4. The semiconductor device of claim 1, comprising multiple through-connections extending between the first main face and the second main face of the semiconductor chip.

5. The semiconductor device of claim 4, wherein the first metal layer and the second metal layer are substantially coplanar to the first main face, each connected to a separate one of the multiple through-connections.

6. A semiconductor device comprising:
   a semiconductor chip comprising a through-connection extending between a first main face of the semiconductor chip and a second main face of the semiconductor chip opposite the first main face;
   encapsulation material at least partially encapsulating the semiconductor chip; and
   a first metal layer disposed over the encapsulation material and connected with the through-connection; and
   a second metal layer disposed over the encapsulation material and connected with the through-connection, wherein the first metal layer is disposed adjacent to the first main face and the second metal layer is disposed adjacent to the second main face, wherein the first and second metal layers each comprise a redistribution layer patterned in a dielectric layer disposed on the encapsulation material.

7. A semiconductor device comprising:
a semiconductor chip comprising a through-connection extending between a first main face of the semiconductor chip and a second main face of the semiconductor chip opposite the first main face;
encapsulation material at least partially encapsulating the semiconductor chip; and
a first metal layer disposed over the encapsulation material and connected with the through-connection; and
a second metal layer disposed over the encapsulation material and connected with the through-connection, wherein the first metal layer is disposed adjacent to the first main face and the second metal layer is disposed adjacent to the second main face, wherein the encapsulation material comprises a first surface opposite a second surface and a through-mold via extending between the first and second surfaces of the encapsulation material.

8. A method of manufacturing a semiconductor device, the method comprising:
providing a semiconductor chip;
forming at least one through-connection extending between a first main face of the semiconductor chip and an opposing second main face of the semiconductor chip;
placing the first main face of the semiconductor chip on a carrier;
applying encapsulation material over the semiconductor chip and the carrier so as to encase all but the first main surface of the semiconductor chip in the encapsulation material;
removing the carrier from the semiconductor chip and the encapsulation material; and
forming at least one through-connection between opposing first and second major surfaces of the encapsulation material, the first major surface of the encapsulation material being coplanar with the first main face of the semiconductor chip and the second major surface of the encapsulation material being disposed above and substantially parallel with the second main face of the semiconductor chip.

9. The method of claim 8, further comprising:
applying a first metal layer adjacent to the first main face of the semiconductor chip.

10. The method of claim 9, further comprising:
electrically coupling the first metal layer with the at least one through-connection.

11. The method of claim 9, further comprising:
applying external connection elements to the first metal layer.

12. The method of claim 8, further comprising:
applying a second metal layer adjacent to the second main face of the semiconductor chip.

13. The method of claim 12, further comprising:
electrically coupling the second metal layer with the at least one through-connection.

14. The method of claim 8, wherein providing a semiconductor chip comprises providing multiple semiconductor chips, each semiconductor chip comprising at least one through-connection extending between a first main face of the semiconductor chip and an opposing second main face of the semiconductor chip.

15. The method of claim 14, wherein applying encapsulation material over the semiconductor chip and the carrier comprises applying encapsulation material over the multiple semiconductor chips and the carrier.

16. The method of claim 15, further comprising:
cutting through the encapsulation material and singulating semiconductor packages each comprising at least one of the semiconductor chips.

17. A method of connecting a package-on-package stack to a board, the method comprising:
obtaining a base semiconductor package comprising a semiconductor chip comprising a through-silicon connection extending between opposing main faces of the semiconductor chip and connected to a first metal layer disposed on a first surface of the base semiconductor package and a second metal layer disposed on a second surface of the base semiconductor package opposite the first surface, and a through-mold connection connected to the first and second metal layers and extending between opposing surfaces of an encapsulation material encasing all but a main face of the semiconductor chip proximate to the second metal layer;
electrically connecting a second semiconductor package eto the first metal layer; and
connecting the second metal layer to an electronic board.

18. The method of claim 17, comprising quality testing at least one of the base semiconductor package and the second semiconductor package.

19. A semiconductor package-on-package stack comprising:
a base semiconductor package comprising a semiconductor chip comprising a through-silicon connection extending between opposing main faces of the semiconductor chip, encapsulation material encapsulating all but one of the opposing main faces of the semiconductor chip and including a through-mold connection extending between opposing main faces of the encapsulation material, a first metal layer disposed on a first surface of the base semiconductor package and connected with the through-silicon and through-mold connections, and a second metal layer disposed on a second surface of the base semiconductor package opposite the first surface and connected with the through-silicon and through-mold connections, the second metal layer configured for electrical connection to a circuit board; and
a second semiconductor package electrically connected to the first metal layer.

20. A semiconductor package-on-package stack comprising:
a base semiconductor package comprising a semiconductor chip comprising a through-connection extending between opposing main faces of the semiconductor chip, encapsulation material partially encapsulating the semiconductor chip, a first metal layer disposed on a first surface of the base semiconductor package and connected with the through-connection, and a second metal layer disposed on a second surface of the base semiconductor package opposite the first surface and connected with the through-connection, the second metal layer configured for electrical connection to a circuit board; and
a second semiconductor package electrically connected to the first metal layer, wherein at least one of the first and second surfaces of the base semiconductor package comprises a dielectric layer, and at least one of the first and second metal layers is patterned in the dielectric layer.

21. The semiconductor package-on-package stack of claim 19, wherein the through-silicon connection has a first width and the through-mold connection has a second width that is larger than the first width.

22. The semiconductor package-on-package stack of claim 19, comprising multiple connection pads disposed on the first surface of the base semiconductor package, each connection pad connected to at least one of multiple through-connections formed to extend between opposing main faces of the semiconductor chip.

* * * * *